(12) United States Patent
Iliasevitch

(10) Patent No.: US 6,255,857 B1
(45) Date of Patent: Jul. 3, 2001

(54) SIGNAL LEVEL SHIFTING CIRCUITS

(75) Inventor: Stepan Iliasevitch, Nepean (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/592,780

(22) Filed: Jun. 13, 2000

(51) Int. Cl.[7] ................................................ H03K 19/084
(52) U.S. Cl. ........................... 326/130; 326/75; 326/124
(58) Field of Search ........................... 326/63, 64, 75–78, 326/89, 124, 126, 130

(56) References Cited

U.S. PATENT DOCUMENTS 4,713,560 * 12/1987 Herndon ................................. 326/126
4,999,519 * 3/1991 Kitsukawa et al. .................... 326/126

* cited by examiner

Primary Examiner—Michael Tokar
Assistant Examiner—Don Phu Le

(57) ABSTRACT

A signal level shifting circuit comprises an emitter-follower transistor with a base supplied with an input signal, a collector coupled to a supply voltage, and an emitter coupled via a level shifter to a bias circuit, whereby a level shifted signal is produced at a junction point between the level shifter and the bias circuit. The level shifter comprises one or more diodes to provide a forward voltage drop providing a signal level shift, a PMOS transistor switch in parallel with the diode(s), and a control circuit responsive to the supply voltage for controlling the switch to bypass the diode(s), thereby providing a smaller level shift, when the supply voltage has a lower one of two possible values. The circuit can have a differential input and a differential output stage, and cascode-connected transistors for reducing voltages so that the circuit can be implemented using BCMOS technology.

20 Claims, 2 Drawing Sheets

SIGNAL LEVEL SHIFTING CIRCUITS

This invention relates to signal level shifting circuits, and is particularly concerned with a signal level shifting circuit which can be used for coupling a signal between BCMOS (bipolar transistor and complementary metaloxide-semiconductor field effect transistor) circuits operating with different supply voltages.

BACKGROUND

In order to couple a signal between different devices (e.g. integrated circuits) or circuits which operate with different supply voltages, it is known to perform a level shifting of the signal, this being achieved by a level shifting circuit or interface circuit between the devices. The level shifting circuit can be regarded as an output circuit of the device supplying the signal, as an input circuit or buffer of the device receiving the signal, or as a separate interface circuit between the two devices. Typically, the extent of the level shifting will depend upon the differences between the supply voltages of the devices, and the nominal signal levels which typically also depend on the supply voltages.

For example, especially for handling signals at very high frequencies (e.g. 5 GHz), integrated circuit devices using BCMOS technology may be used which operate with nominal supply voltages of either +1.8 volts and −5 volts or 0 (zero) volts and −5 volts, in each case typically with a tolerance of ±10%. In the former case, a signal may have high and low voltage levels of 1.8 and 1.4 volts respectively, with a signal voltage swing of 0.4 volts; under worst case conditions, this signal voltage swing may be as little as 0.2 volts. In the latter case, a signal may have high and low voltage levels of 0 and −0.8 volts respectively, with a signal voltage swing of 0.8 volts; under worst case conditions, this signal voltage swing may be as much as 1.0 volts.

From these figures, it can be seen that an integrated circuit device with a differential supply voltage of about 7.5 volts (1.8 +5 volts, plus 10%) may produce a signal voltage swing of only about 0.2 volts, and a device with a differential supply voltage of 4.5 volts (5 volts minus 10%) may produce a signal voltage swing of 1 volt. Thus there is considerable variability of both the signal voltage swing and the differential supply voltages which may be present.

A considerable problem is presented in providing an appropriate interface circuit, for example as an input buffer to a device operating with the nominal 0 and −5 volt supply voltages, which can properly handle signals from a preceding device which may correspond to either of the two cases discussed above. Such an interface or signal level shifting circuit is desired to handle, relatively arbitrarily, a signal with either set of supply voltages and signal voltage swings, because a preceding device producing the signal may fit either of these two cases.

This problem is exacerbated by constraints which are imposed by the BCMOS technology and the desired functioning of the devices. For example, BCMOS technology may impose a constraint that a maximum voltage difference between any two terminals of any transistor or other active device be no more than 3.6 volts for devices operating at signal frequencies, or about 4.5 volts for devices used for biasing. In addition, the devices are desired to have substantially constant biasing conditions under the different possible signal handling conditions, to ensure that performance (e.g. bandwidth) is not dependent upon the nature of the supplied signal. In addition, low power dissipation is desired.

A need exists to provide a signal level shifting circuit which enables these desires to be satisfied.

SUMMARY OF THE INVENTION

According to one aspect of this invention there is provided a signal level shifting circuit comprising: an input transistor having a base coupled to an input terminal for an input signal, a collector coupled to a terminal for a supply voltage, and an emitter; at least one diode coupling the emitter of the input transistor to a junction point for providing a level shifted signal; a bias circuit coupled to the junction point for conducting a current which flows via a collector-emitter path of the input transistor and via said at least one diode to provide a forward voltage drop of said at least one diode providing a level shift of the input signal; at least one transistor switch having a controlled path in parallel with said at least one diode; and a control circuit responsive to said supply voltage for controlling said at least one transistor switch to be non-conductive when said supply voltage has a first, relatively higher, value and to be conductive when said supply voltage has a second, relatively lower, value, the conductive state of said at least one transistor switch providing a reduced voltage level shift of the input signal when said supply voltage has the second value.

Another aspect of the invention provides a differential signal level shifting circuit comprising: two bipolar input transistors each with an emitter-follower configuration having bases coupled to input terminals for a differential input signal, collectors coupled to a supply voltage, and emitters coupled via respective level shifters and respective junction points to respective bias circuits; and an output stage comprising two differentially-connected bipolar transistors having their bases coupled to the two junction points and providing a differential output signal from their collectors; wherein each of the level shifters comprises at least one diode arranged to provide a forward voltage drop providing a signal level shift, and at least one transistor switch having a controlled path in parallel with said at least one diode; the differential signal level shifting circuit also comprising a control circuit responsive to said supply voltage for controlling each transistor switch to be non-conductive when said supply voltage has a first value and to be conductive when said supply voltage has a second value less than the first value.

The invention also provides a signal level shifting circuit comprising a bipolar transistor having an emitter-follower configuration with a base supplied with an input signal, a collector coupled to a supply voltage, and an emitter coupled via a level shifter to a bias circuit, whereby a level shifted signal is produced at a junction point between the level shifter and the bias circuit, wherein the level shifter comprises: at least one diode arranged for conducting current between the emitter of the bipolar transistor and the junction point to provide a forward voltage drop providing a signal level shift; a MOS field effect transistor having a gate and having a source-drain path coupled in parallel with said at least one diode; and a control circuit having an output coupled to said gate, the control circuit being responsive to said supply voltage for controlling said MOS field effect transistor so that its source-drain path is non-conductive when said supply voltage has a first value and is conductive when said supply voltage has a second value less than the first value.

In addition, the invention provides a method of providing either of two different level shifts for an input signal which is supplied to the base of a bipolar transistor in an emitter-follower configuration in dependence upon a supply voltage supplied to a collector of the transistor, comprising the steps of: when the supply voltage has a first value, providing a level shift by a forward voltage drop of at least one diode connected to an emitter of the transistor; and in response to the supply voltage having a second value less than the first value, closing a transistor switch in parallel with said at least one diode to reduce said level shift.

BRIEF DESCRIPTION OF THE DRAWINGS

The invention will be further understood from the following description by way of example with reference to the accompanying drawings, in which.

DETAILED DESCRIPTION

The following description relates to signal level shifting, or interface, circuits for handling differential signals as is preferred, and it can be appreciated that the same principles can be applied for non-differential (single-ended) signals if desired.

Figure 1:
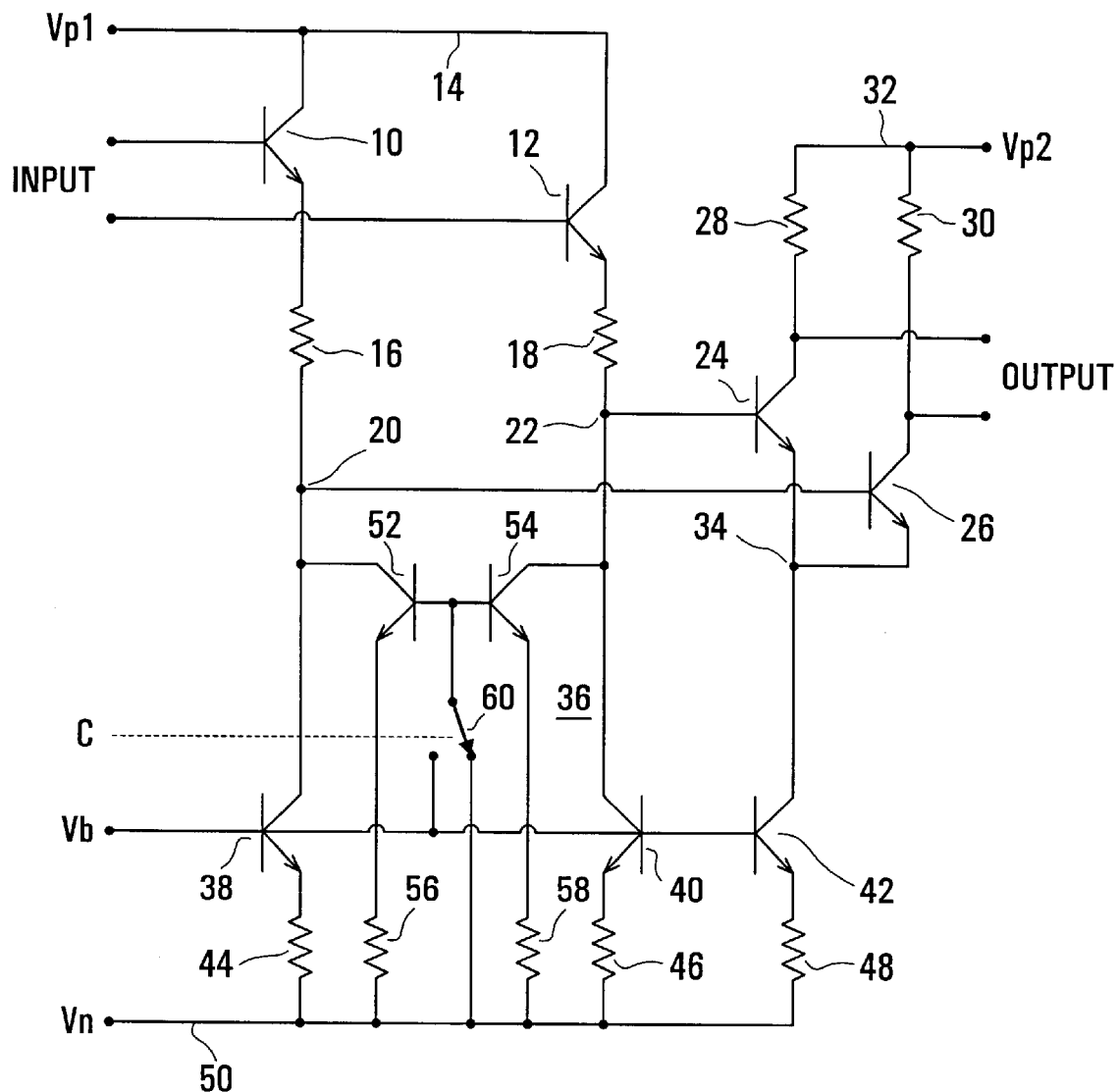
FIG. 1 schematically illustrates a level shifting circuit with reference to which disadvantages reduced by the invention are explained.

It is well known that a signal level shift can be provided by a resistor connected to the emitter of a bipolar transistor connected in an emitter-follower configuration, the signal being supplied to the base of the transistor and the resistor passing a predetermined current. FIG. 1 illustrates a level shifting circuit which uses such a known arrangement.

Accordingly, in the level shifting circuit of FIG. 1 bipolar transistors 10 and 12 have their bases coupled to differential input signal terminals, their collectors coupled to a line 14 to which a supply voltage Vp1 is supplied, and their emitters coupled via respective resistors 16 and 18 to junction points 20 and 22 respectively. A differential output stage of the level shifting circuit of FIG. 1 comprises bipolar transistors 24 and 26 having their bases coupled to the junction points 20 and 22 respectively, their collectors connected to respective differential output signal terminals and via resistors 28 and 30 respectively to a line 32 to which a supply voltage Vp2 is supplied, and their emitters coupled together at a junction point 34.

The level shifting circuit of FIG. 1 also includes a biassing arrangement 36 coupled to the junction points 20, 22, and 34 for conducting predetermined currents. In known manner, the biassing arrangement 36 includes transistors 38, 40, and 42 having their collectors connected to the junction points 20, 22, and 34 respectively, their bases all coupled to a terminal for a bias voltage Vb, and their emitters coupled via resistors 44, 46, and 48 respectively, each having a relatively small resistance, to a line 50 to which a supply voltage Vn is supplied.

In addition, the biassing arrangement 36 in the level shifting circuit of FIG. 1 includes further transistors 52 and 54 having their collectors coupled to the junction points 20 and 22 respectively, their emitters coupled via resistors 56 and 58, each having a relatively small resistance, to the line 50, and their bases coupled together and via a switch 60 selectively, under the control of a switch control signal C, to the line 50 in the switch position shown or to the terminal for the bias voltage Vb in an alternative switch position. In practice the switch 60 would be constituted by transistor switches. The control signal C is produced in dependence upon the supply voltage Vp1 as described below.

In operation of the level shifting circuit of FIG. 1, the supply voltage Vp1 supplied to the line 14 is nominally either 1.8 volts or 0 volts as discussed above, the supply voltage Vp2 supplied to the line 32 is 0 volts, and the supply voltage Vn supplied to the line 50 is −5 volts.

In the event that the supply voltage Vp1 is 0 volts, then the control signal C causes the switch 60 to have the position shown, in which the bases of the transistors 52 and 54 are coupled to the line 50 so that these transistors are non-conductive. If for example the differential input signal is such that the base of the transistor 10 is at 0 volts (and the base of the transistor 12 is at −0.8 volts), then the transistor 10 conducts current to produce a voltage drop of the order of 0.3 volts across the resistor 16, so that the junction point 20 is at a voltage of about −1.1 volts (the base-emitter voltage of the transistor 10 being about 0.8 volts). The junction point 22 is at a more negative voltage, so that in the differential output stage the transistor 26 conducts and the transistor 24 is non-conductive, providing a desired differential output voltage (e.g. 0 volts at the collector of the transistor 24, and −0.3 volts at the collector of the transistor 26) at the differential output of the level shifting circuit.

Conversely, in the event that the supply voltage Vp1 is nominally 1.8 volts, then the control signal C causes the switch 60 to have its alternative position, in which the bases of the transistors 52 and 54 are coupled to the bias voltage terminal so that these transistors are conductive to provide for additional current flow via the transistors 10 and 12 and the resistors 16 and 18. If for example the differential input signal is such that the base of the transistor 10 is at 1.8 volts (and the base of the transistor 12 is at nominally 1.4 volts, the voltage swing being smaller in this case as discussed above), then the transistor 10 conducts current to produce a voltage drop of the order of 2.1 volts across the resistor 16, so that the junction point 20 is again at a voltage of about −1.1 volts (the base-emitter voltage of the transistor 10 being about 0.8 volts). The junction point 22 is again at a more negative voltage, so that in the differential output stage the transistor 26 conducts and the transistor 24 is non-conductive, providing the desired differential output voltage as described above.

It can be seen, therefore, that the switching of additional current provided by the switch 60 and the transistors 52 and 54 enables a desired differential output voltage to be provided by the level shifting circuit of FIG. 1 in each of the two cases discussed above. An analysis of the circuit of FIG. 1 in conjunction with the tolerances discussed above shows that this can be achieved within the voltage constraints indicated above for BCMOS technology. However, the level shifting circuit of FIG. 1 has disadvantages which make it undesirable.

More particularly, the presence of the resistors 16 and 18 results in an undesirably high power dissipation in the case of the supply voltage Vp1 being nominally 1.8 volts, and there is a large variation in power dissipation between the two cases discussed. The required resistance of the resistors 16 and 18 is sufficiently high that, in combination with input capacitance of the differential transistors 24 and 26 of the output stage, a resulting filter is formed which detracts from high frequency performance of the level shifting circuit. In addition, there is a large difference in current flow (a ratio of 2.1 to 0.3, or 7 to 1, as described above) via the transistors 10 and 12 between the two cases, so that these transistors operate under different bias conditions and provide different or non-optimal performance (e.g. bandwidth) in the two cases.

Figure 2:
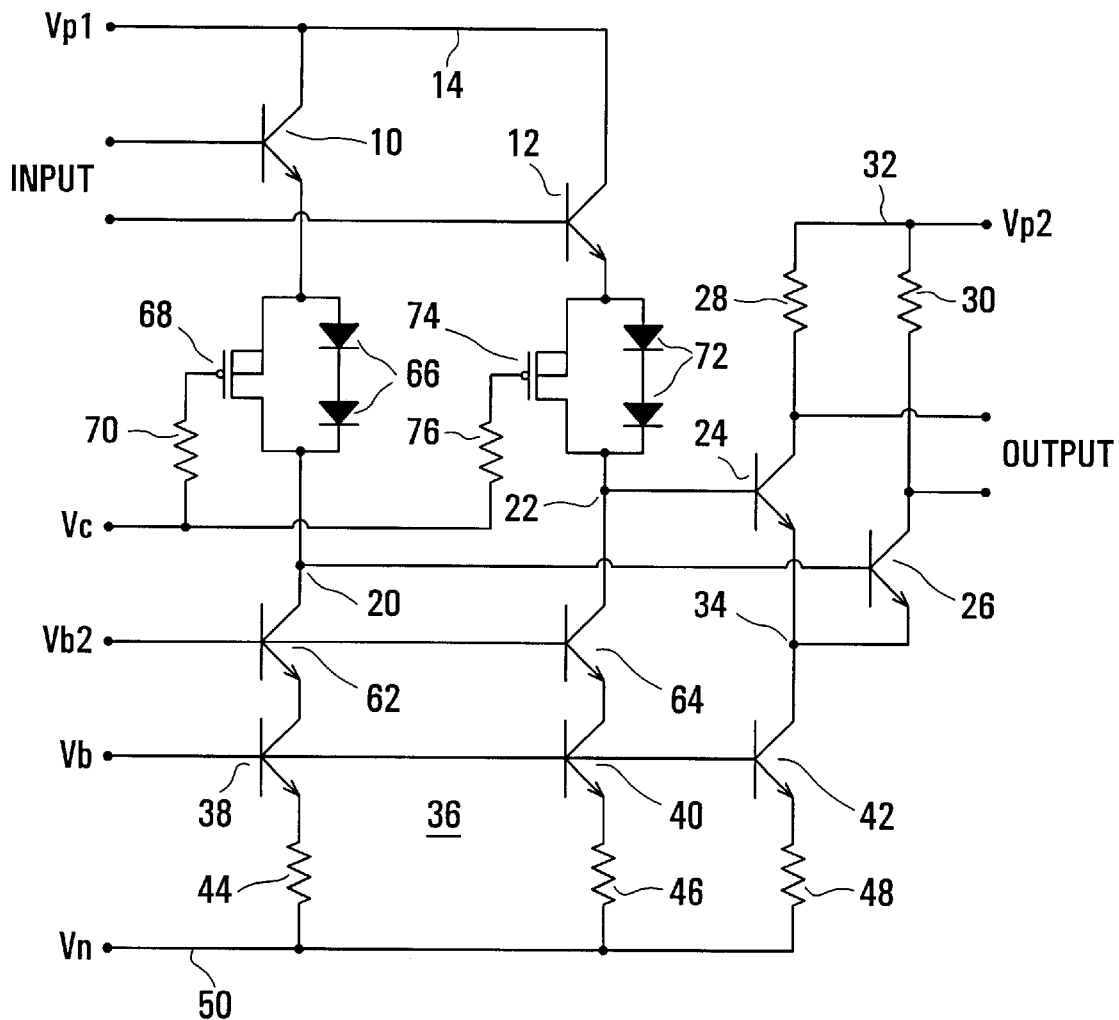
FIG. 2 schematically illustrates a level shifting circuit in accordance with an embodiment of this invention.

FIG. 2 illustrates a level shifting circuit in accordance with an embodiment of this invention, in which some or all of these disadvantages are reduced or avoided. The same references are used in FIG. 2 to identify corresponding elements that are also present in the circuit of FIG. 1 as described above.

Thus the level shifting circuit of FIG. 2 includes the emitter-follower transistors 10 and 12 coupled to the input terminals and to the line 14, the junction points 20 and 22, the differential output stage comprising the elements 24 to 32, the junction point 34, and the elements 38 to 50 (but not the elements 52 to 60) of the biassing arrangement 36, all as in the level shifting circuit of FIG. 1. As in the level shifting circuit of FIG. 1, in operation of the level shifting circuit of FIG. 2 supply voltages Vp1, Vp2, and Vn are supplied to the lines 14, 32, and 50 respectively, and a bias voltage Vb is supplied to the bases of the transistors 38, 40, and 42 of the biassing arrangement 36.

In addition, as shown the biassing arrangement 36 of the level shifting circuit of FIG. 2 includes cascode-connected bipolar transistors 62 and 64, whose bases are connected to another terminal for receiving another bias voltage Vb2. Thus the collectors of the transistors 38 and 40 are in this case coupled to the junction points 20 and 22 respectively via the cascode-connected transistors 62 and 64 respectively, the collectors of the transistors 62 and 64 being connected to the junction points 20 and 22 respectively, and the emitters of the transistors 62 and 64 being connected to the collectors of the transistors 38 and 40 respectively. The purpose of these cascode-connected transistors 62 and 64 is described below.

Instead of the resistor 16 as in the level shifting circuit of FIG. 1, in the level shifting circuit of FIG. 2 the emitter of the transistor 10 is coupled to the junction point 20 by a circuit comprising a parallel connection of two series-connected diodes 66 and the source-drain path of a PMOS transistor 68, a gate of the transistor 68 being connected via a resistor 70 to a terminal to which a control voltage Vc is supplied in operation as described further below. The diodes 66, which conveniently can be constituted by diode-connected transistors as is well known in the art, are connected so as to be forward biassed for conducting the collector-emitter current of the transistor 10. The PMOS transistor 68 has its source connected to the emitter of the transistor 10 and its drain connected to the junction point 20.

Similarly, instead of the resistor 18 as in the level shifting circuit of FIG. 1, in the level shifting circuit of FIG. 2 the emitter of the transistor 12 is coupled to the junction point 22 by a level shifter comprising a parallel connection of two series-connected diodes 72 and the source-drain path of a PMOS transistor 74, a gate of the transistor 74 being connected via a resistor 76 to the terminal for the control voltage Vc.

The control voltage Vc is produced, for example as described further below, in dependence upon the supply voltage Vp1 relative to the supply voltage Vp2. More particularly, if the supply voltage Vp1 is nominally 1.8 volts and the supply voltage Vp2 is 0 volts, then the control voltage Vc is high so that the PMOS transistors 68 and 74 are non-conductive. The collector-emitter currents of the transistors 10 and 12 then flow via the series-connected diodes 66 and 72 respectively, in each case producing a voltage drop totalling 2 Vbe, where Vbe is the forward voltage drop of the base-emitter junction of a diode-connected transistor, or of a diode. This total voltage drop is typically about 1.6 volts.

Conversely, if the supply voltages Vp1 and Vp2 are both 0 volts, then the control voltage Vc is low (negative) to cause the PMOS transistors 68 and 74 to be conductive, so that they conduct the collector-emitter currents of the transistors 10 and 12 respectively. In this case there is a very small voltage drop, of about 0.1 volt, between the emitters of the transistors 10 and 12 and the junction points 10 and 12 respectively, due to the very low resistance of the conductive channels of the PMOS transistors 68 and 74, and the diodes 66 and 72 are effectively shorted by the conductive transistors 68 and 74 respectively.

In the two cases (Vp1 being nominally 1.8 volts or 0 volts) discussed above the same bias current is supplied by the bias transistors 38 and 40, so that the bias conditions of the transistors 10 and 12 are substantially the same in the two cases, as is desirable. This bias current can be relatively small, for example 0.25 mA for signal frequencies of 5 GHz, in comparison to at least the larger current (due to the current ratio of 7 to 1) required for the level shifting circuit of FIG. 1 in the event that the supply voltage Vp1 is 1.8 volts.

In each case in the level shifting circuit of FIG. 2 there is a very small resistance between the emitters of the transistors 10 and 12 and the junction points 20 and 22 respectively, due to the low resistance provided by the forward biassed diodes 66 and 72 in the case that the supply voltage Vp1 is nominally 1.8 volts, and due to the low resistance of the source-drain paths of the PMOS transistors 68 and 74 when these are conductive in the case that the supply voltage Vp1 is nominally 0 volts. As a result, there is very little power dissipation in the diodes 66 and 72 and in the PMOS transistors 68 and 74. Furthermore, due to the low resistances the frequency responses of the filters provided by these resistances with the input capacitances of the output stage transistors 24 and 26 are substantially increased, thereby reducing any adverse effects on the high frequency performance of the level shifting circuit of FIG. 2.

Accordingly, the level shifting circuit of FIG. 2 provides substantial advantages over that of FIG. 1, while still providing a level shifting which is appropriate for each of the two cases, i.e. two possibilities for the supply voltage Vp1, discussed above.

The amount of this level shifting may be adjusted by providing different numbers of diodes 66 and 72. As described above and shown in FIG. 2, there are two diodes 66 and two diodes 72 providing a forward voltage drop of the order of 1.6 volts. If a smaller, or larger, voltage drop is desired, it can be provided by only a single diode, or three or more series-connected diodes, instead of the two diodes illustrated. In the event that more than two diodes are connected in series, then in order to meet a BCMOS technology constraint that transistor terminals do not differ by more than 3.6 volts, additional PMOS transistors such as the transistors 68 and 72 may be required with the source-drain paths of these transistors in parallel with respective ones or groups of the diodes. For example, with four series-connected diodes between the emitter of the transistor 10 and the junction point 20, two such PMOS transistors may be provided, one with its source-drain path in parallel with the two diodes closest to the emitter of the transistor 10 and the other with its source-drain path in parallel with the two diodes closest to the junction point 20, and both simultaneously controlled by one or more gate control voltages such as the control voltage Vc as shown in FIG. 2.

It can be seen that in the level shifting circuit of FIG. 2, with a supply voltage Vp1 of nominally 1.8 volts and for example with a high (nominally 1.8 volts) input level applied to the base of the transistor 10, the junction point 20 will be at a voltage of Vp1–3Vbe. With a +10% variation of both of the supply voltages Vp1 and Vn, and a minimum value of Vbe of about 0.76 volts, it can be seen that the junction point 20 will be at a voltage of –0.3 volts, which is 5.2 volts more positive than the line 50. With a voltage drop across the resistor 44 of typically less than 0.2 volts, this leaves a voltage of more than 5 volts between the junction point 20 and the emitter of the transistor 38.

In order to meet the 4.5 volt constraint for this bias transistor 38, in the level shifting circuit of FIG. 2 the transistor 62 is also present to provide a voltage drop across its collector-emitter path, so that the collector-emitter paths of the transistors 38 and 62 share the total voltage drop of more than 5 volts as discussed above. The cascode-connected transistor 64 provides a similar function for the bias transistor 40. For example, the bias voltage Vb2 applied to the bases of the cascode-connected transistors 62 and 64 may be about Vp1–3Vbe. Without these cascode-connected transistors 62 and 64, the transistors of the level shifting circuit of FIG. 2 would not comply with the BCMOS technology constraints mentioned above under all conditions of the signal and voltage levels and tolerances described here. However, it can be appreciated that with other signal and voltage levels and tolerances, or different technology constraints, these cascode-connected transistors may not be required and may be omitted.

As shown in FIG. 2 and described further below, the same control voltage Vc is supplied via the resistors 70 and 76 to the gates of the PMOS transistors 68 and 74. Alternatively, separate control voltages can be provided for the gates of the two transistors 68 and 74, and advantageously these control voltages can be generated in dependence upon the input signal levels to provide a constant gate-source control voltage for each PMOS transistor. In this case the two separate control voltages for the PMOS transistors 68 and 74 can be produced by a control voltage circuit in dependence upon the supply voltages Vp1 and Vp2 and the input signal. Also in this case the resistors 70 and 76 via which the control voltages are supplied to the gates of the PMOS transistors 68 and 74 desirably have relatively high resistances, in order to reduce the effects of gate capacitance of the PMOS transistors.

Figure 3:
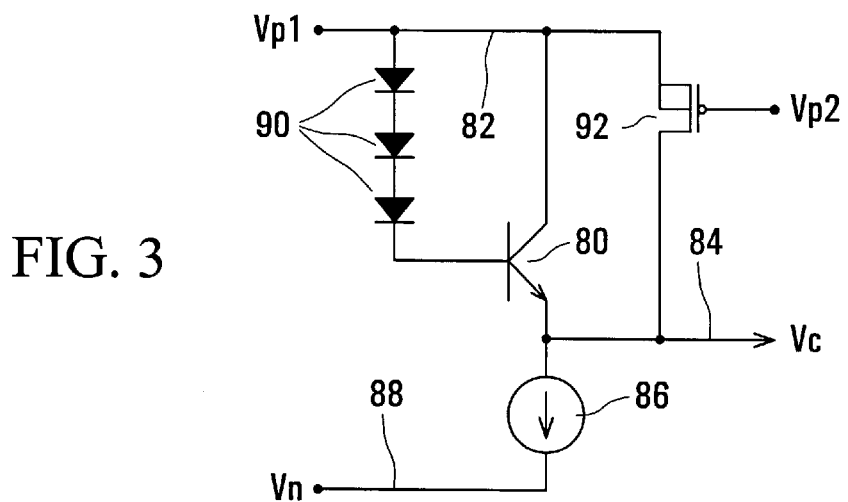
FIG. 3 schematically illustrates one form of control voltage circuit which may be used for the level shifting circuit of FIG. 2.

However, in the level shifting circuit as shown in FIG. 2 the PMOS transistors 68 and 74 are more simply controlled in common by a single control voltage Vc, which can for example be produced by a control voltage circuit as shown in FIG. 3.

Referring to FIG. 3, this control voltage circuit comprises a bipolar transistor 80, having its collector connected to a line 82 to which the supply voltage Vp1 is supplied and having its emitter connected to a line 84 on which the control voltage Vc is produced and via a constant current sink 86, which may be constituted by a resistor having a high resistance, to a line 88 to which the supply voltage Vn is supplied. The voltage control circuit also includes a plurality of, three as shown in FIG. 3, diodes (or diode-connected transistors) 90 connected in series between the line 82 and the base of the transistor 80 so as to conduct base current to the transistor 80, and a PMOS transistor 92 having its source connected to the line 82, its drain connected to the line 84, and its gate supplied with the supply voltage Vp2.

In operation of the voltage control circuit of FIG. 3, if the supply voltage Vp1 is nominally 1.8 volts and the supply voltage Vp2 is 0 volts, then the PMOS transistor 92 is turned on to couple the line 84 to the line 82, so that the control voltage Vc is high (nominally 1.8 volts). In this case, as described above, the PMOS transistors 68 and 74 are non-conductive and the diodes 66 and 72 provide the desired voltage drop in the level shifting circuit of FIG. 2. conversely, if the supply voltages Vp1 and Vp2 are both 0 volts, then the PMOS transistor 92 is non-conductive. The transistor 80 is forward biassed by the series-connected diodes 90 and its collector-emitter path conducts the current of the current sink 86, producing at its emitter, and hence as the control voltage Vc on the line 84, a voltage which is equal to the supply voltage Vp1 minus the voltage drop of the diodes 90 and the base-emitter voltage of the transistor 80. With three series-connected diodes 90 as shown, the control voltage Vc is Vp1–4Vbe, or about –3 volts, in this case. This low control voltage Vc turns on the PMOS transistors 68 and 74 in the level shifting circuit of FIG. 2 as described above.

It can be appreciated that a level shifting circuit in accordance with an embodiment of the invention as described above can be conveniently provided for example as an input circuit or buffer of a BCMOS integrated circuit device, which can accordingly be supplied with the output signal of a preceding device which may arbitrarily have a supply voltage Vp1 of 1.8 volts or 0 volts. The level shifting circuit provides an appropriate level shift in either case, and its differential output stage provides a consistent output signal relatively independent of the input signal levels and the supply voltage Vp1. At the same time, this is achieved with consistent bias conditions of the level shifting circuit, and hence a consistent frequency response which is not adversely affected by resistance-capacitance filter characteristics of the level shifting circuit, and with a low current requirement and consequent low power dissipation.

Although particular voltage and signal levels, and voltage constraints of a particular technology, are discussed above, it should be appreciated that these are given only by way of example and the invention is not limited to these. Consequently, the invention is also not limited to particular numbers of diodes such as the series-connected diodes 66, 72, and 90, or particular numbers or types of transistors such as the PMOS transistors 68 and 74 having controlled paths in parallel with diodes, to provide particular voltage drops or level shifts. Furthermore, it can be appreciated that particular voltage drops or level shifts which may be desired can be provided by additional components. For example, in addition to at least one diode 66 and at least one transistor 68, the level shifting circuit may include one or more diodes in the path between the emitter of the transistor 10 and the junction 20 without a parallel controlled path of a transistor to provide a desired voltage drop in both of the supply voltage Vp1 cases discussed above. Alternatively, or in addition, a resistor having a relatively low resistance can be provided in series with the diodes 66, or the controlled (source-drain) path of the transistor 68, or both, to provide an additional small voltage drop which may be desirable.

Thus although a particular embodiment of the invention has been described in detail above, it can be appreciated that these and numerous other modifications, variations, and adaptations may be made without departing from the scope of the invention as defined in the claims.

What is claimed is:

1. A signal level shifting circuit comprising:
    an input transistor having a base coupled to an input terminal for an input signal, a collector coupled to a terminal for a supply voltage, and an emitter;

at least one diode coupling the emitter of the input transistor to a junction point for providing a level shifted signal;

a bias circuit coupled to the junction point for conducting a current which flows via a collector-emitter path of the input transistor and via said at least one diode to provide a forward voltage drop of said at least one diode providing a level shift of the input signal;

at least one transistor switch having a controlled path in parallel with said at least one diode; and a control circuit responsive to said supply voltage for controlling said at least one transistor switch to be non-conductive when said supply voltage has a first, relatively higher, value and to be conductive when said supply voltage has a second, relatively lower, value, the conductive state of said at least one transistor switch providing a reduced voltage level shift of the input signal when said supply voltage has the second value.

2. A signal level shifting circuit as claimed in claim 1 wherein said at least one diode comprises a plurality of series-connected diodes.

3. A signal level shifting circuit as claimed in claim 1 wherein said at least one transistor switch comprises a MOS field effect transistor having a source-drain path constituting said controlled path and a gate responsive to an output of the control circuit.

4. A signal level shifting circuit as claimed in claim 1 wherein the bias circuit comprises a bias transistor having a base arranged to receive a bias voltage, an emitter coupled to a supply voltage, and a collector coupled to said junction point.

5. A signal level shifting circuit as claimed in claim 4 wherein the bias circuit further includes a cascode-connected transistor having a base arranged to receive another bias voltage, a collector connected to said junction point, and an emitter connected to the collector of the bias transistor whereby the collector of the bias transistor is coupled to the junction point via a collector-emitter path of the cascode-connected transistor.

6. A differential signal level shifting circuit comprising two signal level shifting circuits each as claimed in claim 1 for providing a level shifted differential signal at two junction points, and a differential output stage comprising two differentially-connected bipolar transistors having their bases coupled to the two junction points and providing a differential output signal from their collectors.

7. A differential signal level shifting circuit comprising:

two bipolar input transistors each with an emitter-follower configuration having bases coupled to input terminals for a differential input signal, collectors coupled to a supply voltage, and emitters coupled via respective level shifters and respective junction points to respective bias circuits; and an output stage comprising two differentially-connected bipolar transistors having their bases coupled to the two junction points and providing a differential output signal from their collectors;

wherein each of the level shifters comprises at least one diode arranged to provide a forward voltage drop providing a signal level shift, and at least one transistor switch having a controlled path in parallel with said at least one diode;

the differential signal level shifting circuit also comprising a control circuit responsive to said supply voltage for controlling each transistor switch to be non-conductive when said supply voltage has a first value and to be conductive when said supply voltage has a second value less than the first value.

8. A differential signal level shifting circuit as claimed in claim 7 wherein in each of said level shifters said at least one diode comprises a plurality of series-connected diodes.

9. A differential signal level shifting circuit as claimed in claim 7 wherein in each of said level shifters said at least one transistor switch comprises a MOS field effect transistor having a source-drain path constituting said controlled path and a gate responsive to an output of the control circuit.

10. A differential signal level shifting circuit as claimed in claim 7 wherein each of said respective bias circuits comprises a bias transistor having a base arranged to receive a bias voltage, an emitter coupled to a supply voltage, and a collector coupled to the respective one of said junction points.

11. A differential signal level shifting circuit as claimed in claim 10 wherein each of said respective bias circuits further includes a cascode-connected transistor having a base arranged to receive another bias voltage, a collector connected to the respective one of said junction points, and an emitter connected to the collector of the respective bias transistor whereby the collector of the respective bias transistor is coupled to the respective junction point via a collector-emitter path of the respective cascode-connected transistor.

12. A signal level shifting circuit comprising a bipolar transistor having an emitter-follower configuration with a base supplied with an input signal, a collector coupled to a supply voltage, and an emitter coupled via a level shifter to a bias circuit, whereby a level shifted signal is produced at a junction point between the level shifter and the bias circuit, wherein the level shifter comprises:

at least one diode arranged for conducting current between the emitter of the bipolar transistor and the junction point to provide a forward voltage drop providing a signal level shift;

a MOS field effect transistor having a gate and having a source-drain path coupled in parallel with said at least one diode; and a control circuit having an output coupled to said gate, the control circuit being responsive to said supply voltage for controlling said MOS field effect transistor so that its source-drain path is non-conductive when said supply voltage has a first value and is conductive when said supply voltage has a second value less than the first value.

13. A signal level shifting circuit as claimed in claim 12 wherein said at least one diode comprises a plurality of series-connected diodes.

14. A signal level shifting circuit as claimed in claim 12 wherein the bias circuit comprises a bias transistor having a base arranged to receive a bias voltage, an emitter coupled to a supply voltage, and a collector coupled to said junction point.

15. A signal level shifting circuit as claimed in claim 14 wherein the bias circuit further includes a cascode-connected transistor having a base arranged to receive another bias voltage, a collector connected to said junction point, and an emitter connected to the collector of the bias transistor whereby the collector of the bias transistor is coupled to the junction point via a collector-emitter path of the cascode-connected transistor.

16. A differential signal level shifting circuit comprising two signal level shifting circuits each as claimed in claim 12 for providing a level shifted differential signal at two junction points, and a differential output stage comprising two differentially-connected bipolar transistors having their bases coupled to the two junction points and providing a differential output signal from their collectors.

17. A differential signal level shifting circuit comprising two signal level shifting circuits each as claimed in claim 13 for providing a level shifted differential signal at two junction points, and a differential output stage comprising two differentially-connected bipolar transistors having their bases coupled to the two junction points and providing a differential output signal from their collectors.

18. A differential signal level shifting circuit comprising two signal level shifting circuits each as claimed in claim 14 for providing a level shifted differential signal at two junction points, and a differential output stage comprising two differentially-connected bipolar transistors having their bases coupled to the two junction points and providing a differential output signal from their collectors.

19. A differential signal level shifting circuit comprising two signal level shifting circuits each as claimed in claim 15 for providing a level shifted differential signal at two junction points, and a differential output stage comprising two differentially-connected bipolar transistors having their bases coupled to the two junction points and providing a differential output signal from their collectors.

20. A method of providing either of two different level shifts for an input signal which is supplied to the base of a bipolar transistor in an emitter-follower configuration in dependence upon a supply voltage supplied to a collector of the transistor, comprising the steps of:

when the supply voltage has a first value, providing a level shift by a forward voltage drop of at least one diode connected to an emitter of the transistor; and in response to the supply voltage having a second value less than the first value, closing a transistor switch in parallel with said at least one diode to reduce said level shift.

* * * * *